(12) United States Patent
Okabe et al.

(10) Patent No.: US 11,871,523 B2
(45) Date of Patent: Jan. 9, 2024

(54) ELECTRONIC COMPONENT MODULE AND METHOD FOR MANUFACTURING ELECTRONIC COMPONENT MODULE

(71) Applicant: Murata Manufacturing Co., Ltd., Nagaokakyo (JP)

(72) Inventors: Ryohei Okabe, Nagaokakyo (JP); Toru Komatsu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/662,687

(22) Filed: May 10, 2022

(65) Prior Publication Data

US 2022/0264748 A1   Aug. 18, 2022

Related U.S. Application Data

(63) Continuation of application No. PCT/JP2020/043596, filed on Nov. 24, 2020.

(30) Foreign Application Priority Data

Dec. 20, 2019 (JP) ................... 2019-229956

(51) Int. Cl.
*H05K 1/18* (2006.01)
*H05K 3/28* (2006.01)
(Continued)

(52) U.S. Cl.
CPC ............ *H05K 3/284* (2013.01); *H01L 23/28* (2013.01); *H05K 1/181* (2013.01); *H05K 9/0073* (2013.01);
(Continued)

(58) Field of Classification Search
CPC ..... H05K 1/02; H05K 1/14; H05K 1/141–147; H05K 1/18;
(Continued)

(56) References Cited

U.S. PATENT DOCUMENTS

2010/0164646 A1 *  7/2010  Nakanishi ............ H03H 9/6483
                                                          29/25.35
2014/0284783 A1 *  9/2014  Sayama ................ H01L 23/295
                                                          257/690

(Continued)

FOREIGN PATENT DOCUMENTS

JP       2004-356436 A    12/2004
JP       2009-084651 A     4/2009
(Continued)

OTHER PUBLICATIONS

International Search Report for International Patent Application No. PCT/JP2020/043596 dated Feb. 9, 2021.

*Primary Examiner* — Tuan T Dinh
(74) *Attorney, Agent, or Firm* — Pearne & Gordon LLP

(57) ABSTRACT

An electronic component module includes a substrate, an electronic component, an insulating resin, and a shield film. The insulating resin covers a first main surface side of the substrate. The insulating resin exposes an opposite surface of the electronic component. The shield film covers the insulating resin and the opposite surface of the electronic component. The opposite surface has an uneven portion. A concave portion of the uneven portion has a smoother shape than a convex portion of the uneven portion.

7 Claims, 6 Drawing Sheets

(51) Int. Cl.
*H01L 23/28* (2006.01)
*H05K 9/00* (2006.01)

(52) U.S. Cl.
CPC .............. *H05K 2203/025* (2013.01); *H05K 2203/0264* (2013.01); *H05K 2203/107* (2013.01)

(58) Field of Classification Search
CPC .... H05K 1/181–187; H05K 7/02; H05K 7/05; H01L 21/561; H01L 21/568; H01L 23/552; H01L 23/66
USPC .......... 361/782–790, 816, 818; 257/660–690
See application file for complete search history.

(56) References Cited

U.S. PATENT DOCUMENTS

| | | | |
|---|---|---|---|
| 2017/0040112 A1* | 2/2017 | Tanaka | ................... H01G 4/232 |
| 2018/0269181 A1* | 9/2018 | Yang | ..................... H01L 21/561 |
| 2019/0230781 A1* | 7/2019 | Onodera | ................ H05K 1/165 |
| 2019/0237378 A1 | 8/2019 | Kobayashi et al. | |
| 2019/0269046 A1 | 8/2019 | Takizawa et al. | |
| 2019/0273312 A1 | 9/2019 | Otsubo | |
| 2020/0137893 A1 | 4/2020 | Nomura et al. | |
| 2020/0161252 A1* | 5/2020 | Yang | ..................... H01L 21/568 |

FOREIGN PATENT DOCUMENTS

| | | |
|---|---|---|
| JP | 2018-067600 A | 4/2018 |
| JP | 2018-088460 A | 6/2018 |
| JP | 2019-149466 A | 9/2019 |
| WO | 2018/101384 A1 | 6/2018 |
| WO | 2019/004332 A1 | 1/2019 |

\* cited by examiner

ELECTRONIC COMPONENT MODULE AND METHOD FOR MANUFACTURING ELECTRONIC COMPONENT MODULE

CROSS REFERENCE TO RELATED APPLICATION

This is a continuation of International Application No. PCT/JP2020/043596 filed on Nov. 24, 2020 which claims priority from Japanese Patent Application No. 2019-229956 filed on Dec. 20, 2019. The contents of these applications are incorporated herein by reference in their entireties.

BACKGROUND OF THE DISCLOSURE

Field of the Disclosure

The present disclosure relates to an electronic component module in which an electronic component is mounted on a substrate.

Description of the Related Art

Patent Literature 1 describes a high frequency module in which electronic components are mounted on a main surface of a wiring substrate. The electronic components are a semiconductor element and a chip component.

The main surface of the wiring substrate and the electronic components are covered with a sealing resin layer. An outer surface of the sealing resin layer is covered with a shield layer.

Patent Literature 1

Japanese Patent Unexamined Publication No. 2018-88460 bulletin

BRIEF SUMMARY OF THE DISCLOSURE

In contrast to the configuration disclosed in Patent Literature 1, there is a configuration in which a sealing resin layer is ground until a semiconductor element (semiconductor IC), which is an electronic component, is exposed, and a shield layer is directly formed on a surface of the semiconductor element.

In this case, the surface of the semiconductor element may be ground more than a little together with the sealing resin layer, and accordingly, a grinding mark having a sharp shape may be formed. The shield layer may be cracked or peeled off along this grinding mark. When cracking or peeling of the shield layer occurs, the electromagnetic shielding property of a high frequency module is deteriorated.

Therefore, an object of the present disclosure is to provide an electronic component module that suppresses occurrence of cracking and peeling of a shield film.

An electronic component module according to the present disclosure includes a substrate having a first main surface and a second main surface, the second main surface side being a mount side; a first electronic component mounted on the first main surface and having a facing surface facing the substrate and an opposite surface opposite to the facing surface; an insulating resin covering the first main surface side; and a shield film covering the insulating resin. The opposite surface is exposed from the insulating resin. The shield film covers the opposite surface. The opposite surface has an uneven portion. A concave portion of the uneven portion has a smoother shape than a convex portion of the uneven portion.

According to this configuration, a grinding mark is eliminated by the uneven portion. Since the concave portion is smooth, occurrence of a sharp cut that may cause cracking or the like is suppressed.

According to the present disclosure, occurrence of cracking and peeling of a shield film can be suppressed.

DETAILED DESCRIPTION OF THE DISCLOSURE

First Embodiment

Figure 1A:
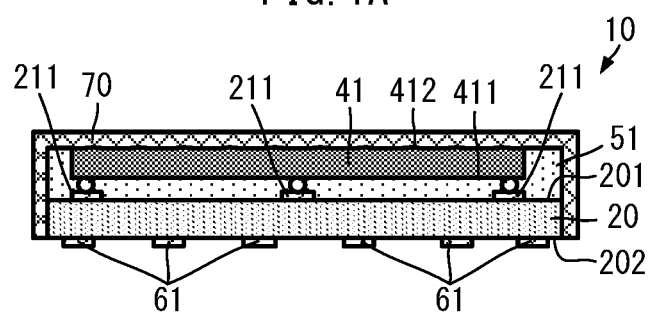
FIG. 1A is a side sectional view illustrating a configuration of an electronic component module according to the first embodiment.
Figure 1B:
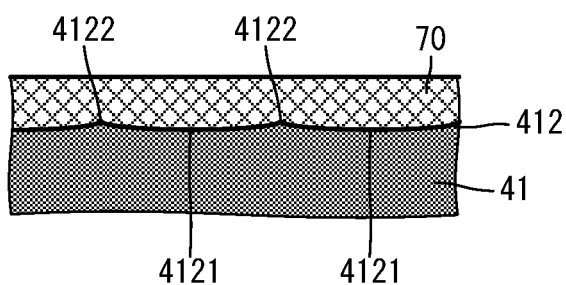
FIG. 1B is a side sectional view enlarging a shape of an opposite surface of an electronic component.

An electronic component module according to a first embodiment of the present disclosure will be described with reference to the drawings. FIG. 1A is a side sectional view illustrating a configuration of an electronic component module according to the first embodiment, and FIG. 1B is a side sectional view enlarging a shape of an opposite surface of an electronic component.

As illustrated in FIG. 1A, an electronic component module includes a substrate 20, an electronic component 41, an insulating resin 51, a plurality of terminal conductors 61, and a shield film 70.

The substrate 20 has an insulating main body and includes a conductor pattern for realizing the electronic component module 10. The substrate 20 is, for example, configured such that a plurality of insulator layers having a predetermined conductor pattern are stacked. Note that illustration of the conductor pattern formed inside the substrate 20 is omitted. The substrate 20 is, for example, a rectangular flat plate, and has a first main surface 201 and a second main surface 202 facing each other. The substrate 20 is a ceramic multilayer substrate. Alternatively, the substrate 20 may be a resin multilayer substrate.

A plurality of land conductors 211 are provided on the first main surface 201 of the substrate 20. The number and arrangement of the land conductors 211 correspond to the number and arrangement of terminals of the electronic component 41.

A plurality of terminal conductors 61 are provided on the second main surface 202 of the substrate 20. The plurality of terminal conductors 61 are external connection terminals of the electronic component module 10.

The electronic component 41 uses a semiconductor. For example, the electronic component 41 is, for example, a so-called bare chip semiconductor IC that is not individually molded with an insulating resin or the like. The electronic component 41 corresponds to a "first electronic component" of the present disclosure. The electronic component 41 may be a piezoelectric element.

The electronic component 41 has a facing surface 411 facing the substrate and an opposite surface 412 opposite to the facing surface. For example, solder bumps or the like are provided on the facing surface 411. A functional circuit of the electronic component 41 is, for example, provided on and near the surface of the facing surface 411. Solder bumps or the like are not provided on the opposite surface 412.

The electronic component 41 is a component that can be thinned by grinding a semiconductor. In this case, the opposite surface 412 side is ground.

The electronic component 41 is disposed on the first main surface 201 side of the substrate 20. Specifically, the electronic component 41 is disposed such that the facing surface 411 faces the first main surface 201 of the substrate 20. The electronic component 41 is bonded (mounted) to the land conductors 211 by using solder or the like.

The insulating resin 51 covers the first main surface 201 side of the substrate 20. More specifically, the insulating resin 51 covers the facing surface 411 and side surfaces of the electronic component 41. In other words, the opposite surface 412 of the electronic component 41 is exposed to an outside from the insulating resin 51.

By providing the insulating resin 51, the electronic component 41 and the conductor pattern provided on the first main surface 201 of the substrate 20 can be protected from an external environment.

The shield film 70 is a conductive film. The shield film 70 covers an entire outer surface of the insulating resin 51, the opposite surface 412 of the electronic component 41, and entire side surfaces of the substrate 20. By thus disposing the shield film 70, it is possible to suppress unnecessary coupling and interference between the electronic component 41 and the electric configuration provided on the substrate 20 and the external environment. The shield film 70 is preferably connected to a ground potential. This is realized, for example, by exposing a ground electrode (not illustrated) in an inner layer of the substrate 20 from a substrate side surface and connecting the shield film 70 to the exposed ground electrode. A thickness (average thickness) of the shield film 70 is, for example, 1.0 μm or more and 10.0 μm or less.

In such a configuration, the electronic component module 10 has a configuration illustrated in FIG. 1B.

As illustrated in FIG. 1B, in the electronic component module 10, the opposite surface 412 of the electronic component 41 has an uneven portion in which a concave portion 4121 and a convex portion 4122 alternately appear. The uneven portion is provided on the entire opposite surface 412. The uneven portion may be provided on at least a part of the opposite surface 412, but is preferably provided on the entire surface.

Further, the concave portion 4121 has a smoother shape than the convex portion 4122. In other words, the concave portion 4121 has no abrupt change in shape of the outer surface, and a rate of change in shape of the concave portion 4121 is also smaller than that of the convex portion 4122.

With such a configuration, it is possible to suppress a sharp cut that advances from the opposite surface 412 of the electronic component 41 made of a semiconductor to the inside of the electronic component 41. Therefore, the electronic component module 10 can suppress occurrence of cracking and peeling of the shield film 70 caused by the cut. As a result, the electronic component module 10 can realize highly reliable shielding performance.

The surface roughness (for example, arithmetic mean roughness Ra) of the uneven portion is preferably less than 1.0 μm. The threshold 1.0 μm is a value derived by the inventor through an experiment. Specifically, an experiment of occurrence of cracking or peeling was conducted while setting a minimum thickness of the shield film in actual specifications to 2.0 μm, and it was experimentally found that cracking or peeling hardly occurred when the surface roughness was less than 1.0 μm and cracking or peeling easily occurred when the surface roughness was 1.0 μm or more. Therefore, when the surface roughness is within this range, occurrence of cracking and peeling can be more reliably suppressed.

With this configuration, since the electronic component 41 is ground, a height of the electronic component module 10 is reduced. Therefore, the electronic component module 10 can realize a reduction in height while achieving highly reliable shielding performance.

Figure 2:
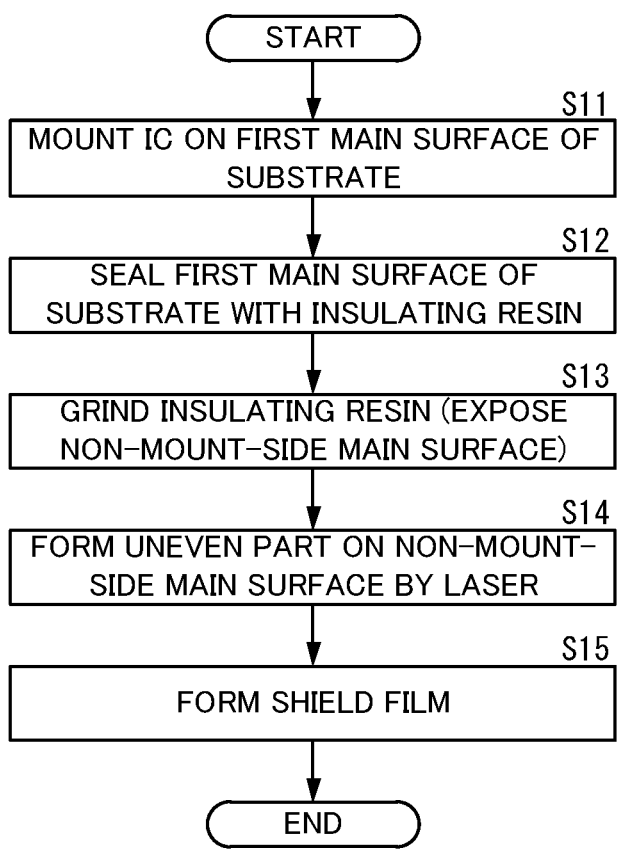
FIG. 2 is a flowchart illustrating a method for manufacturing an electronic component module according to the first embodiment.

The electronic component module 10 having such a configuration can be provided by the following manufacturing method. FIG. 2 is a flowchart illustrating a method for manufacturing an electronic component module according to the first embodiment. FIGS. 3A, 3B, 3C, and 3D are side sectional views illustrating a configuration in each step of the manufacturing process.

Figure 3A:
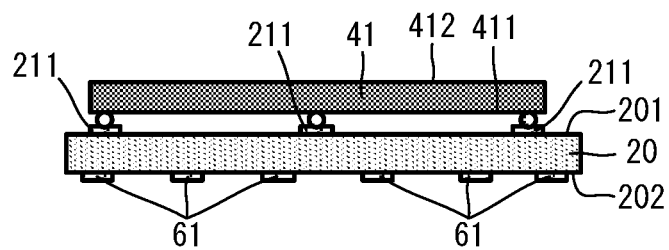
FIGS. 3A, 3B, 3C, and 3D are side sectional views illustrating a configuration in each step of the manufacturing process.

First, as illustrated in FIG. 3A, the electronic component 41 made of a semiconductor IC or the like is mounted on the first main surface 201 of the substrate 20 (S11).

Figure 3B:
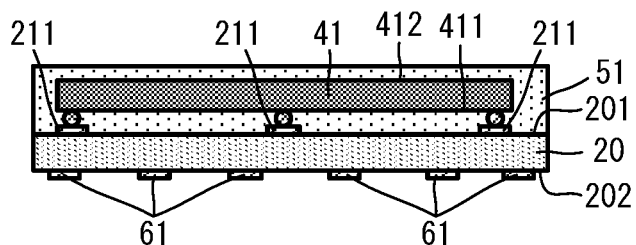

Next, as illustrated in FIG. 3B, the first main surface 201 side of the substrate 20 is sealed with the insulating resin 51. The insulating resin 51 is formed so as to cover the entire electronic component 41.

Figure 3C:
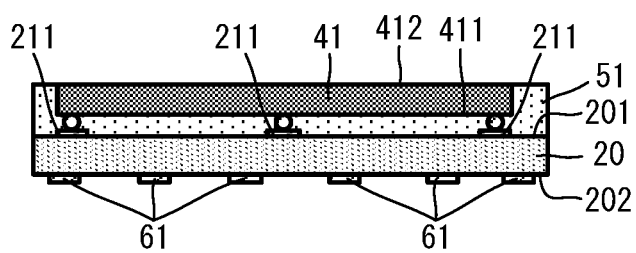

Next, as illustrated in FIG. 3C, on the first main surface 201 side of the substrate 20, the insulating resin 51 is ground from a surface of the insulating resin 51 opposite to a contact surface with the first main surface 201 until the opposite surface 412 of the electronic component 41 is exposed. It is better to grind the electronic component 41 to such an extent that no problem occurs in reliability and electrical characteristics of the electronic component 41. This makes it possible to further reduce a size of the electronic component module 10.

Figure 3D:
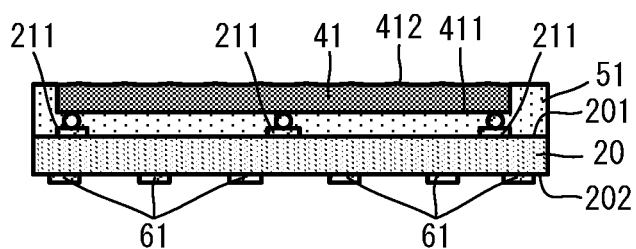

Next, as illustrated in FIG. 3D, the opposite surface 412 of the electronic component 41 is irradiated with a laser to form the uneven portion (the concave portion 4121 and the convex portion 4122) (S14). The laser light is laser light having a wavelength that does not pass through the electronic component main body. For example, in a case where the electronic component 41 is made of a Si semiconductor, it is preferable to use a UV laser, whereas in a case where the electronic component 41 is made of a piezoelectric body, not only a UV laser but also a green laser (wavelength: 532 μm) can be used. More specifically, on the opposite surface 412, the laser light is converged so that the laser light has a circular shape having a predetermined diameter (so that a laser spot having a predetermined area is formed). In this state, laser marks are formed on the entire opposite surface 412 by scanning the opposite surface 412 with laser light in a direction parallel to the opposite surface 412. A portion where a center portion of the laser spot hits becomes the concave portion 4121, and a portion where an outer peripheral portion of the laser spot hits becomes the convex portion 4122. By thus using the laser marks, the surface of the concave portion 4121 becomes smooth as illustrated in FIG. 1B. As a result, cracking and breakage of the shield film 70 is less likely to occur. Furthermore, although the convex portion 4122 is not smooth as the concave portion 4121, the shield film 70 easily adheres to the convex portion 4122, and therefore cracking and breakage of the shield film 70 is less likely to occur.

Next, the shield film 70 is formed, for example, by sputtering or the like. In this way, the electronic component module 10 having the configuration illustrated in FIGS. 1A and 1B is formed. Use of this manufacturing method makes it possible to manufacture the electronic component module 10 that can suppress occurrence of cracking and breakage of the shield film 70 with more certainty and ease.

Second Embodiment

Figure 4:
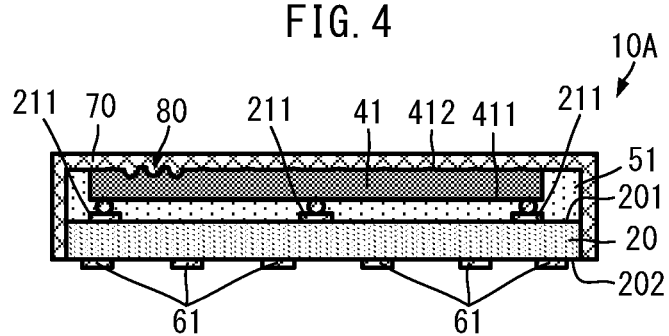
FIG. 4 is a side sectional view illustrating a configuration of an electronic component module according to the second embodiment.

An electronic component module according to a second embodiment of the present disclosure will be described with reference to the drawings. FIG. 4 is a side sectional view illustrating a configuration of the electronic component module according to the second embodiment.

As illustrated in FIG. 4, an electronic component module 10A according to the second embodiment is different from the electronic component module 10 according to the first embodiment in that a printing portion 80 is provided. Other configurations of the electronic component module 10A are similar to those of the electronic component module 10, and description of the similar parts will be omitted.

The electronic component module 10A includes the printing portion 80. The printing portion 80 is provided on an opposite surface 412 of an electronic component 41. The printing portion 80 is realized by a groove (printing groove) formed on the opposite surface 412. A depth of the printing portion 80 is larger than surface roughness of an uneven portion. Accordingly, even if there is an uneven portion, characters on the printing portion 80 can be easily recognized.

The printing portion 80 is formed for example, by irradiation with laser light, similarly to the uneven portion. For example, the irradiation with the laser beam for the printing portion 80 is performed after the irradiation with the laser beam for the uneven portion. In this case, the irradiation condition of the laser light used for forming the printing portion 80 is different from the irradiation condition of the laser light used for forming the uneven portion. For example, as the irradiation condition of the laser light used for forming the printing portion 80, pulse energy is set higher or a pulse irradiation density is set higher by setting a high pulse frequency at a low sweep rate. As a result, the depth of the printing portion 80 becomes larger than the surface roughness of the uneven portion.

Since such a printing portion 80 is also formed by irradiation with laser light, a bottom surface of the groove is smooth. Therefore, occurrence of cracking and breakage of a shield film 70 is also suppressed at the bottom of the printing portion 80.

As a result, even in a case where the printing portion 80 is provided, the electronic component module 10A can realize highly reliable shielding performance. Further, by providing the printing portion 80, even if the electronic component 41 is ground and original printing of the electronic component 41 is deleted, the printing portion 80 can reproduce the printing.

Third Embodiment

Figure 5:
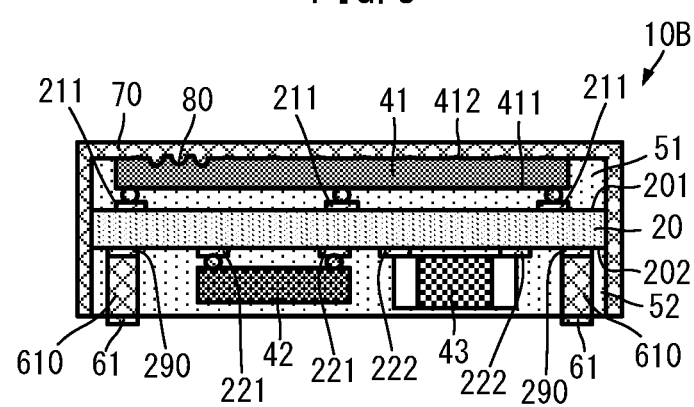
FIG. 5 is a side sectional view illustrating a configuration of an electronic component module according to the third embodiment.

An electronic component module according to a third embodiment of the present disclosure will be described with reference to the drawings. FIG. 5 is a side sectional view illustrating a configuration of the electronic component module according to the third embodiment.

As illustrated in FIG. 5, an electronic component module 10B according to the third embodiment is different from the electronic component module 10A according to the second embodiment in that mounting type electronic components are also mounted on a second main surface 202 side of a substrate 20. That is, the electronic component module 10B is a so-called double-sided mounting type. Other configurations of the electronic component module 10B are similar to those of the electronic component module 10A, and description of the similar parts will be omitted.

The electronic component module 10B includes an electronic component 42, an electronic component 43, an insulating resin 52, and columnar conductors 610 on the second main surface 202 side of the substrate 20.

A plurality of land conductors 221, a plurality of land conductors 222, and a plurality of terminal conductors for external connection 290 are provided on the second main surface 202 of the substrate 20. The number and arrangement of the land conductors 221 correspond to the number and arrangement of terminals of the electronic component 42. The number and arrangement of the land conductors 222 correspond to the number and arrangement of terminals of the electronic component 43. The plurality of terminal conductors for external connection 290 are arranged along an outer peripheral end in the vicinity of the outer peripheral end on the second main surface 202 of the substrate 20. Note that the plurality of terminal conductors for external connection 290 need not necessarily be arranged along the outer peripheral end of the substrate, and may be, for example, arranged between the electronic component 42 and the electronic component 43.

The electronic component 42 and the electronic component are, for example, semiconductor ICs, resin-molded active elements (e.g., transistors), chip capacitor elements, chip inductor elements, chip resistance elements, or the like. The electronic component 42 and the electronic component 43 correspond to a "second electronic component" of the present disclosure.

The electronic component 42 is bonded (mounted) to the land conductors 221 by using solder or the like. The electronic component 43 is bonded (mounted) to the land conductors 222 by using solder or the like.

The columnar conductors 610 are, for example, made of a metal such as copper. The columnar conductors 610 are bonded (mounted) to the terminal conductors for external connection 290 by using solder or the like. The columnar conductors 610 are projecting electrodes formed by plating or the like, metal pins, via conductors, or the like. Solder bumps may be used instead of the columnar conductors.

The insulating resin 52 covers the second main surface 202 side of the substrate 20. The insulating resin 52 covers the electronic component 42, the electronic component 43, and the columnar conductors 610. By providing the insulating resin 52, the electronic component 42, the electronic component 43, and a conductor pattern provided on the second main surface 202 of the substrate 20 can be protected from an external environment.

Terminal conductors 61 are provided on surfaces of the columnar conductors 610 opposite to surfaces bonded to the terminal conductors for external connection 290. The terminal conductors 61 serve as terminals for mounting the electronic component module 10B on another circuit board. That is, in the electronic component module 10B, the second main surface 202 side of the substrate 20 is a mount side to be mounted on another circuit board.

The shield film 70 covers an entire outer surface of an insulating resin 51, an opposite surface 412 of an electronic component 41, entire side surfaces of the substrate 20, and entire side surfaces of the insulating resin 52. By thus disposing the shield film 70, it is possible to suppress unnecessary coupling and interference between the electronic component 41, the electronic component 42, and the electronic component 43, the electric configuration provided on the substrate 20 and the external environment.

Even in such a double-sided mounting type, the electronic component module 10B can suppress occurrence of cracking and breakage of the shield film due to an uneven portion described above provided on the opposite surface 412 of the electronic component 41 and realize highly reliable shield performance.

Fourth Embodiment

Figure 6:
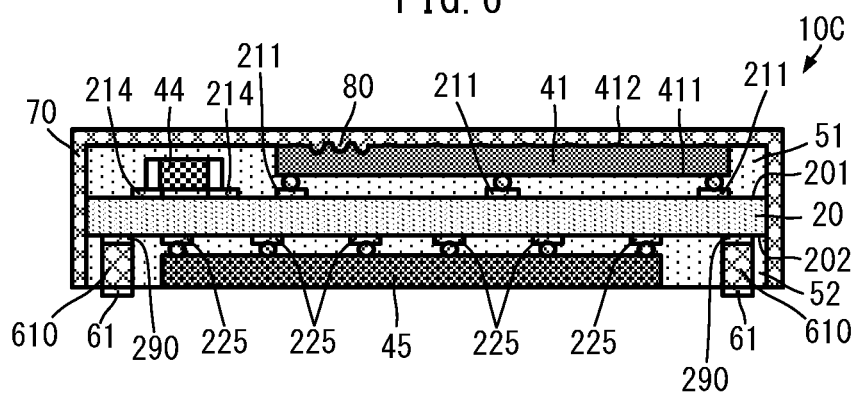
FIG. 6 is a side sectional view illustrating a configuration of an electronic component module according to the fourth embodiment.

An electronic component module according to a fourth embodiment of the present disclosure will be described with reference to the drawings. FIG. 6 is a side sectional view illustrating a configuration of the electronic component module according to the fourth embodiment.

As illustrated in FIG. 6, an electronic component module 10C according to the fourth embodiment is different from the electronic component module 10B according to the third embodiment in configuration of mounting of electronic components. Other configurations of the electronic component module 10C are similar to those of the electronic component module 10B, and description of the similar parts will be omitted.

The electronic component module 10C includes an electronic component 44 and an electronic component 45 instead of the electronic component 42 and the electronic component 43 of the electronic component module 10B. The electronic component 44 is, for example, an electronic component that cannot be ground, and the electronic component 44 is, for example, a resin-molded active element (e.g., transistor), a chip capacitor element, a chip inductor element, a chip resistance element, or the like. A height of the electronic component 44 is lower than a height of an electronic component 41 that has been ground. The electronic component 45 is, for example, an electronic component that can be thinned by grinding. The electronic component 45 is, for example, formed of a semiconductor or a piezoelectric body.

A plurality of land conductors 214 are provided on a first main surface 201 of the substrate 20. The number and arrangement of the land conductors 214 correspond to the number and arrangement of terminals of the electronic component 44. The electronic component 44 is bonded (mounted) to the land conductors 214 by using solder or the like.

A plurality of land conductors 225 are provided on a second main surface 202 of the substrate 20. The number and arrangement of the land conductors 225 correspond to the number and arrangement of terminals of the electronic component 45. The electronic component 45 is bonded (mounted) to the land conductors 225 by using solder or the like.

An opposite surface of the electronic component 45 is flush with a surface of the insulating resin 52 opposite to a contact surface with the substrate 20, and is exposed from the insulating resin 52. Note that any component having a height lower than that of the polished electronic component 45 may be mounted on the second main surface 202 of the substrate 20.

Even with such a configuration, the electronic component module 10C can suppress occurrence of cracking and breakage of the shield film due to an uneven portion described above provided on the opposite surface 412 of the electronic component 41 and realize highly reliable shield performance. Further, according to the electronic component module 10C, the electronic component can be ground to be thin on both the first main surface 201 side and the second main surface 202 side of the substrate 20. As a result, the electronic component module 10C can be thinned in the configuration in which an electronic component is mounted on both surfaces of the substrate 20.

Although an aspect in which one grindable electronic component is mounted on a main surface has been described in each of the above embodiments, a plurality of grindable electronic components may be mounted. Furthermore, the number of electronic components that cannot be ground is not limited to that in the above embodiment.

10, 10A, 10B, 10C electronic component module
20 substrate
41, 42, 43, 44, 45 electronic component
51, 52 insulating resin
61 terminal conductor
70 shield film
80 printing portion
201 first main surface
202 second main surface
211, 214, 221, 222, 225 land conductor
290 terminal conductor for external connection
411 facing surface
412 opposite surface
610 columnar conductor
4121 concave portion
4122 convex portion

The invention claimed is:

1. An electronic component module comprising:
a substrate having a first main surface and a second main surface, the second main surface being a mount side;
a first electronic component mounted on the first main surface and having a facing surface facing the substrate and an opposite surface opposite to the facing surface;
an insulating resin covering a side of the first main surface; and
a shield film covering the insulating resin, wherein
the opposite surface is exposed from the insulating resin,
the shield film covers the opposite surface,
the opposite surface has an uneven portion,
the opposite surface has a printing groove, and a depth of the printing groove is larger than a surface roughness of the uneven portion, and
a concave portion of the uneven portion has a smoother shape than a convex portion of the uneven portion.

2. The electronic component module according to claim 1, wherein the uneven portion is provided on an entire surface of the opposite surface.

3. The electronic component module according to claim 1, further comprising a second electronic component mounted on the second main surface.

4. The electronic component module according to claim 2, further comprising a second electronic component mounted on the second main surface.

5. A method for manufacturing an electronic component module, comprising:
- mounting an electronic component comprising a semiconductor on a first main surface of a substrate;
- covering the first main surface and the electronic component with an insulating resin;
- grinding the insulating resin to expose an opposite surface of the electronic component opposite to a side mounted on the substrate;
- forming, on the opposite surface, an uneven portion in which a concave portion has a smoother shape than a convex portion;
- providing, on the opposite surface, a printing groove with a depth larger than a surface roughness of the uneven portion, and
- covering the opposite surface and an outer surface of the insulating resin with a shield film.

6. The method for manufacturing an electronic component module according to claim 5, wherein the forming of the uneven portion is performed by irradiation with a laser not passing through the semiconductor.

7. The method for manufacturing an electronic component module according to claim 6, wherein the laser is a UV laser or a green laser.

* * * * *